United States Patent
Aketo et al.

(10) Patent No.: US 8,208,271 B2
(45) Date of Patent: Jun. 26, 2012

(54) PRINTED BOARD AND IMAGE FORMATION APPARATUS

(75) Inventors: Atsushi Aketo, Saitama (JP); Hisanori Yukawa, Saitama (JP); Shogo Sata, Saitama (JP); Masaru Yonemochi, Saitama (JP); Hiromasa Kanno, Saitama (JP)

(73) Assignee: Fuji Xerox Co., Ltd, Tokyo (JP)

( * ) Notice: Subject to any disclaimer, the term of this patent is extended or adjusted under 35 U.S.C. 154(b) by 343 days.

(21) Appl. No.: 12/410,747

(22) Filed: Mar. 25, 2009

(65) Prior Publication Data

US 2009/0308648 A1    Dec. 17, 2009

(30) Foreign Application Priority Data

Jun. 11, 2008    (JP) ................................. 2008-153003

(51) Int. Cl.
*H05K 1/11*    (2006.01)

(52) U.S. Cl. ..................... 361/794; 361/306.1; 361/681; 361/760; 361/763; 361/768; 174/34; 174/250; 174/359; 174/394; 343/702; 333/32; 349/149; 340/506

(58) Field of Classification Search .................. 361/794, 361/306.1, 760, 763, 768, 681; 174/34, 250, 174/359, 394; 343/702; 333/32.109, 32, 333/109; 349/149; 340/506
See application file for complete search history.

(56) References Cited

U.S. PATENT DOCUMENTS

| | | | |
|---|---|---|---|
| 4,237,546 A * | 12/1980 | Wells | 710/100 |
| 4,876,737 A * | 10/1989 | Woodworth et al. | 455/12.1 |
| 5,025,248 A * | 6/1991 | Bergeron | 340/596 |
| 5,115,209 A * | 5/1992 | Grace et al. | 331/49 |
| 5,239,983 A * | 8/1993 | Katsurada | 600/178 |
| 5,477,858 A * | 12/1995 | Norris et al. | 600/441 |
| 5,600,503 A * | 2/1997 | Sakogawa | 360/69 |
| 5,739,887 A * | 4/1998 | Ueda et al. | 349/149 |
| 5,740,378 A * | 4/1998 | Rehl et al. | 710/302 |
| 5,892,747 A * | 4/1999 | Okada et al. | 720/647 |
| 6,075,995 A * | 6/2000 | Jensen | 455/552.1 |
| 6,365,828 B1 * | 4/2002 | Kinoshita et al. | 174/359 |
| 6,407,795 B1 * | 6/2002 | Kamizono et al. | 349/149 |
| 6,413,119 B1 * | 7/2002 | Gabrisko et al. | 439/620.1 |
| 6,603,077 B2 * | 8/2003 | Hirai | 174/78 |

(Continued)

FOREIGN PATENT DOCUMENTS

JP    U-04-020295    2/1992

(Continued)

OTHER PUBLICATIONS

Japanese Office Action issued in Japanese Patent Application No. 2008-153003; mailed on May 11, 2010 (with English-language translation).

*Primary Examiner* — Xiaoliang Chen
(74) *Attorney, Agent, or Firm* — Oliff & Berridge, PLC (57) ABSTRACT

A printed board having an input/output terminal that connects with a component in an image formation apparatus through a cable, and a control circuit that controls the component, the printed board which includes a conductive pattern on which a capacitor that suppresses an emission of an electromagnetic wave from the cable is mounted between a grounding surface and a signal line from the input/output terminal, the conductive pattern being formed in the vicinity of the input/output terminal.

5 Claims, 10 Drawing Sheets

U.S. PATENT DOCUMENTS

| | | | |
|---|---|---|---|
| 6,991,473 B1* | 1/2006 | Balcome et al. | 439/67 |
| 7,126,321 B2* | 10/2006 | Shioiri et al. | 324/76.21 |
| 7,299,148 B2* | 11/2007 | Hunt et al. | 702/130 |
| 7,511,938 B2* | 3/2009 | Elam et al. | 361/302 |
| 7,957,169 B2* | 6/2011 | Nakajima et al. | 363/141 |
| 2002/0129951 A1* | 9/2002 | Babb et al. | 174/35 R |
| 2002/0129957 A1* | 9/2002 | Kolb | 174/52.3 |
| 2002/0129971 A1* | 9/2002 | Kolb et al. | 174/256 |
| 2002/0166680 A1* | 11/2002 | Mazurkiewicz | 174/35 R |
| 2002/0166681 A1* | 11/2002 | Mazurkiewicz | 174/35 R |
| 2002/0179313 A1* | 12/2002 | Hirai | 174/34 |
| 2003/0034796 A1* | 2/2003 | Tsujiguchi | 326/22 |
| 2003/0034885 A1* | 2/2003 | Catton et al. | 340/506 |
| 2003/0155987 A1* | 8/2003 | Kolb et al. | 333/12 |
| 2003/0198734 A1* | 10/2003 | Mann | 427/96 |
| 2004/0020673 A1* | 2/2004 | Mazurkiewicz | 174/35 R |
| 2004/0022003 A1* | 2/2004 | Mazurkiewicz | 361/118 |
| 2004/0055770 A1* | 3/2004 | Babb et al. | 174/1 |
| 2004/0082946 A1* | 4/2004 | Malis et al. | 606/34 |
| 2005/0039935 A1* | 2/2005 | Kolb et al. | 174/35 R |
| 2005/0095410 A1* | 5/2005 | Mazurkiewicz | 428/209 |
| 2005/0178582 A1* | 8/2005 | Lee et al. | 174/250 |
| 2005/0275548 A1* | 12/2005 | Abel et al. | 340/614 |
| 2005/0285683 A1* | 12/2005 | Drost et al. | 330/302 |
| 2006/0052969 A1* | 3/2006 | Hunt et al. | 702/130 |
| 2006/0061937 A1* | 3/2006 | Takemoto et al. | 361/328 |
| 2006/0164066 A1* | 7/2006 | Shioiri et al. | 324/76.22 |
| 2006/0184164 A1* | 8/2006 | Malis et al. | 606/34 |
| 2007/0071886 A1* | 3/2007 | Babb et al. | 427/96.3 |
| 2007/0246635 A1* | 10/2007 | Nakajima et al. | 248/637 |
| 2007/0246636 A1* | 10/2007 | Katayama et al. | 248/637 |
| 2007/0263385 A1* | 11/2007 | Fan | 362/252 |
| 2008/0005376 A1* | 1/2008 | Jansen et al. | 710/15 |
| 2008/0007468 A1* | 1/2008 | Sato et al. | 343/702 |
| 2008/0023843 A1* | 1/2008 | Hiraga | 257/773 |
| 2008/0055015 A1* | 3/2008 | Blednov | 333/32 |
| 2008/0061867 A1* | 3/2008 | Kaya | 327/535 |
| 2008/0117067 A1* | 5/2008 | Abel et al. | 340/632 |
| 2008/0206927 A1* | 8/2008 | Graydon et al. | 438/119 |
| 2009/0017773 A1* | 1/2009 | Dupuis et al. | 455/73 |
| 2010/0188164 A1* | 7/2010 | Blednov | 333/109 |

FOREIGN PATENT DOCUMENTS

| | | |
|---|---|---|
| JP | A-06-003877 | 1/1994 |
| JP | A-2001-326432 | 11/2001 |
| JP | A-2004-297031 | 10/2004 |
| JP | A-2005-084497 | 3/2005 |

* cited by examiner

CONTROL BOARD

SURFACE PATTERN

↕ MOUNTED CAPACITOR

↕ THROUGH HOLE FOR CONNECTOR

PRINTED BOARD AND IMAGE FORMATION APPARATUS

CROSS-REFERENCE TO RELATED APPLICATION

This application is based on and claims priority under 35 USC 119 from Japanese Patent Application No. 2008-153003 filed on Jun. 11, 2008.

BACKGROUND

1. Technical Field

The present invention relates to a printed board and an image formation apparatus.

2. Related Art

Recently, electronic information devices have been increasingly used in a situation where those devices are arranged next to each other, and hence problems may occur due to electromagnetic noise generated by each electronic information device.

In some cases, the electromagnetic noise emitted from the electronic information devices has adverse effects on other electronic information devices, such as disturbance of computer screen, noise for cell phones and trouble on medical devices.

Additionally, with the miniaturization and higher performance of electronic parts, the electromagnetic noise generated by the electronic information device may cause malfunctions of not only other electronic information device, but also electronic circuits contained in the noise-generating device itself.

As described above, with the recent deluge of electronic information devices, there has been an increasing demand for a reduction in the unwanted electromagnetic noise emitted from the electronic information devices.

SUMMARY

An aspect of the present invention provides a printed board having an input/output terminal that connects with a component in an image formation apparatus through a cable, and a control circuit that controls the component, the printed board which includes a conductive pattern on which a capacitor that suppresses an emission of an electromagnetic wave from the cable is mounted between a grounding surface and a signal line from the input/output terminal, the conductive pattern being formed in the vicinity of the input/output terminal.

BRIEF DESCRIPTION OF THE DRAWINGS

An exemplary embodiment of the present invention will be described in detail based on the following figures, wherein.

DETAILED DESCRIPTION

Hereinafter, an example of the present invention will be described in detail with reference to the attached drawings.

First, with reference to FIG. 1, a printed board according to the present invention will be described.

Figure 1:
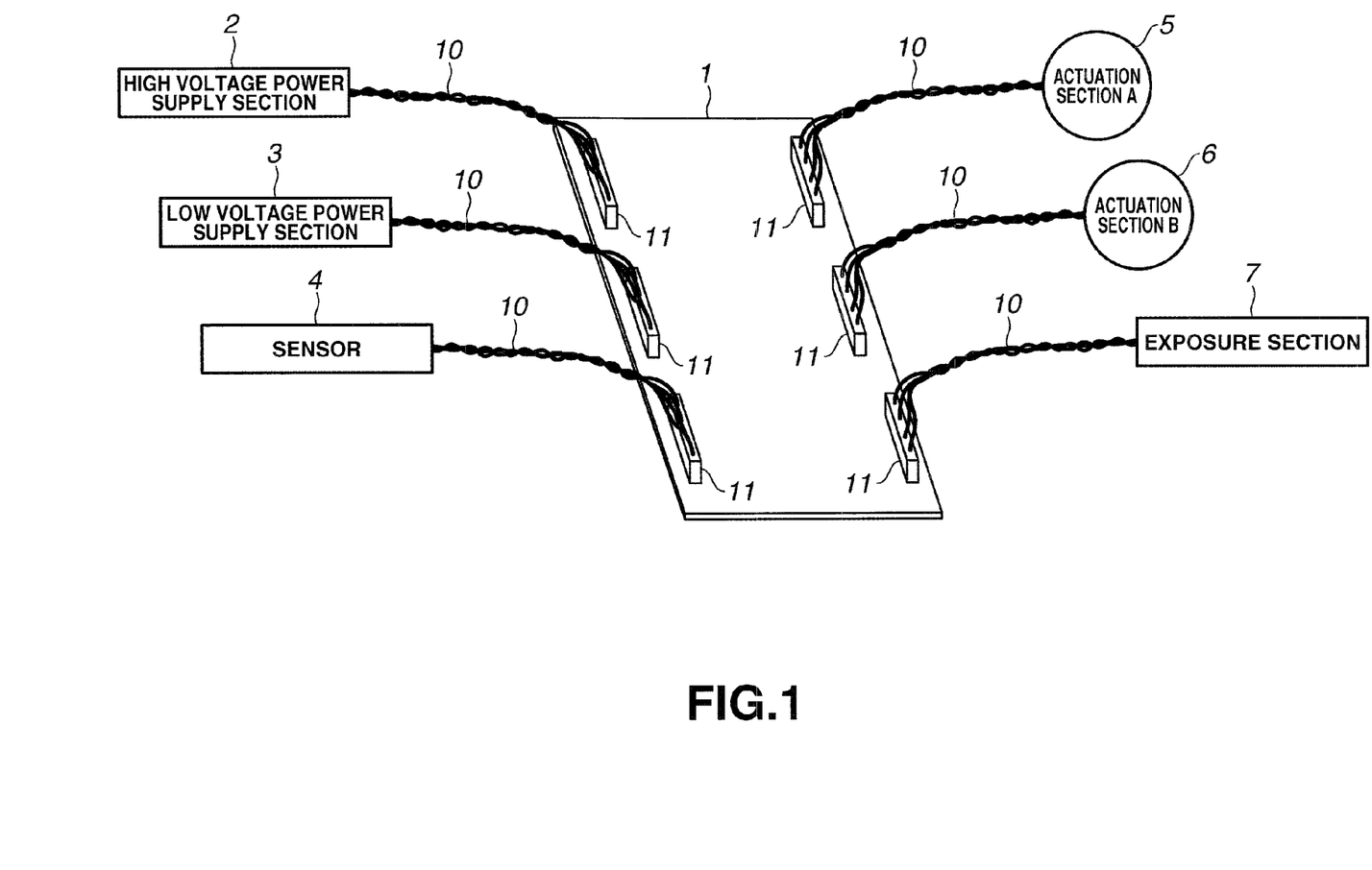
FIG. 1 is a schematic view showing a control board 1.

FIG. 1 is a schematic view showing a control board 1 according to the present invention.

The control board 1 is a printed board on which a control circuit for performing integrated control of the image formation apparatus is formed.

To the control board 1, each component provided in the image formation apparatus and controlled by the control board 1 is connected.

As shown in FIG. 1, the component to be controlled by the control board 1 is each constituent unit that forms the image formation apparatus, including a high voltage power supply section 2, a low voltage power supply section 3, a sensor 4, an actuation section A 5, an actuation section B 6, an exposure section 7 and so on. Additionally, a wire harness 10 that binds wires (cables) is connected to the control board 1 through a connector 11, and the component above is connected to the opposite end of the wires of the wire harness 10 as shown in FIG. 1.

The connection between the wire harness 10 and the control board 1 is not necessarily made by the connector 11, and may be made by soldering each wire of the wire harness 10 on the board or other various connection manners.

Next, a circuit pattern surface of the control board 1 will be described with reference to FIG. 2.

Figure 2:
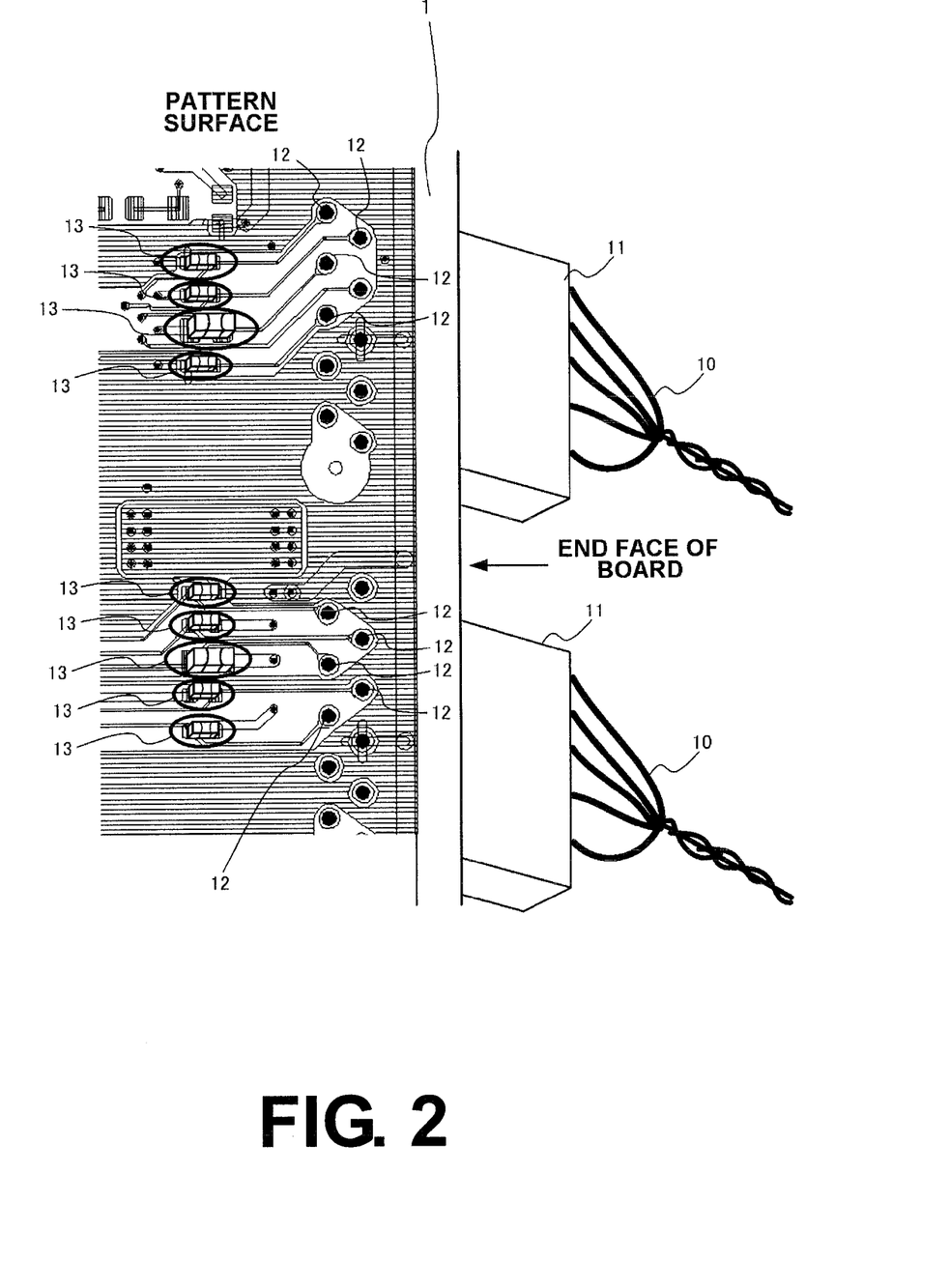
FIG. 2 is a schematic view showing a part of a conductive pattern of the control board 1.

FIG. 2 is a schematic view showing a part of a conductive pattern of the control board 1.

To the control board 1, wire harnesses 10, each of which electrically connects the control board 1 with each component in the image formation apparatus, are connected through connectors 11.

Additionally, in the vicinity of through holes 12 for connecting the connectors 11 with the control board 1, capacitors 15 for suppressing the emission of the unwanted electromagnetic waves from the wire harnesses 10 are provided.

Each of the capacitors 15 is a chip capacitor. On the control board 1, conductive patterns 13 for mounting the chip capacitor 15 are formed.

The capacitance of the capacitor mounted on the conductive pattern may be changed in accordance with a type of signal (such as START, GAIN, ALARM, CLK signal) flowing through one side of the conductive pattern for mounting the capacitor 15. For example, a capacitor having a capacitance of 0.1 micro Farads can be mounted on the conductive pattern 13 that connects with a signal line of a START signal, GAIN signal or ALARM signal, and a capacitor having a capacitance of 6800 picofarads can be mounted on the conductive pattern 13 that connects with a signal line of a CLK signal (clock signal).

Furthermore, the conductive pattern formed on the control board 1 is designed to fit a shape of the chip capacitor to be mounted.

In the following description, the conductive pattern 13 refers to a conductive pattern for mounting the capacitors 15 on the control board 1. A control board 19 refers to the same board as the control board 1 except that the capacitors 15 are not mounted on the conductive pattern 13.

At the time of setting the capacitance of the capacitor 15 as described above, attention should be paid to the signal-risedelay time (TLH) and the signal-fall-delay time (THL) such that each component can sufficiently operate.

As described above, on the control board 1, the capacitance of the capacitor 15 to be mounted can be changed in accordance with the type of signal line. In addition to the type of signal line, the capacitance of the capacitor 15 may be changed in accordance with the type of component connected with the control board 1 through the wire harness 10.

As described above, since the capacitance of the capacitor 15 can be appropriately set for each conductive pattern 13, an input impedance can be independently adjusted for each component.

Next, the conductive pattern 13 on the control board 19 will be described with reference to FIG. 3.

Figure 3:
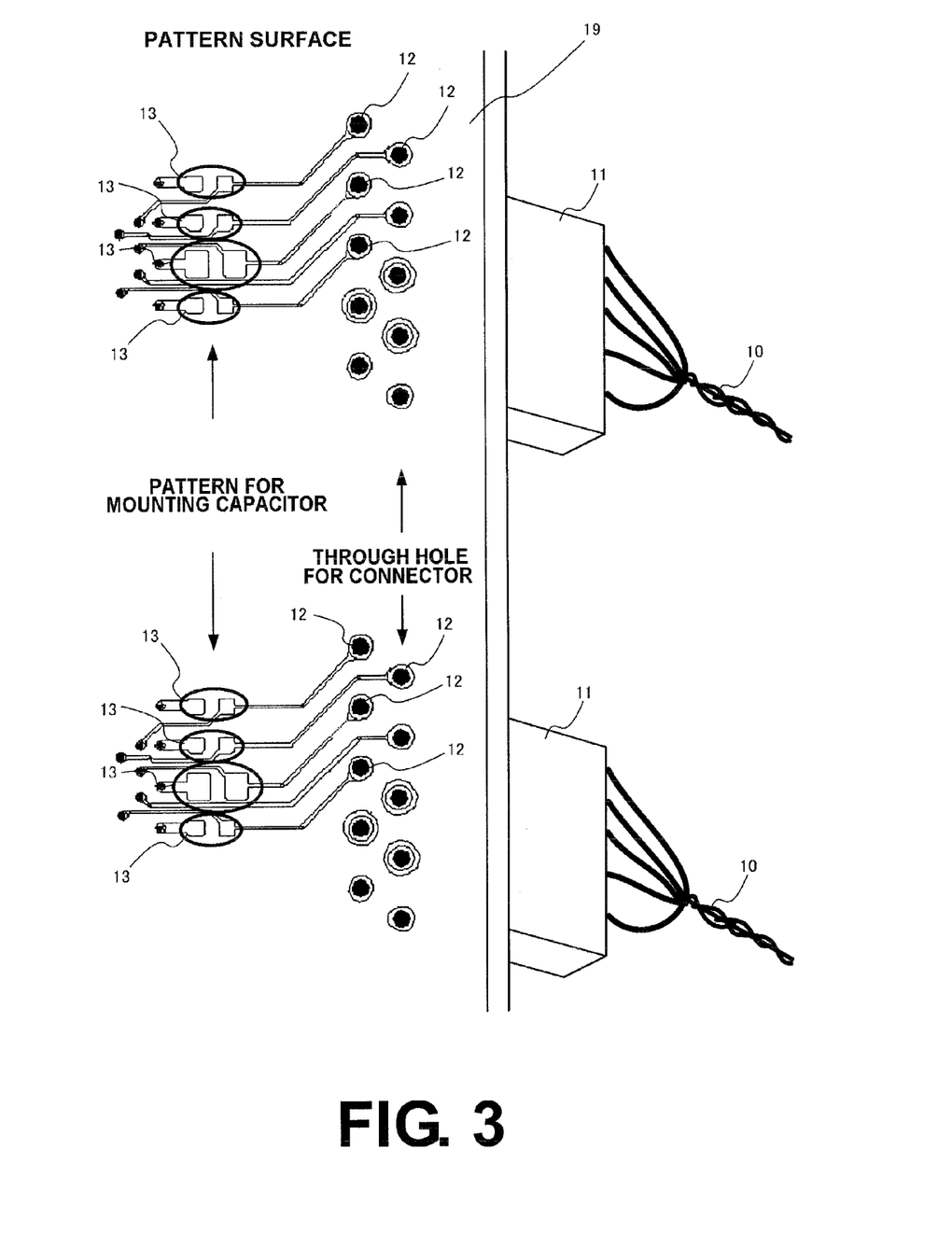
FIG. 3 is a schematic view showing a control board 19 (the same board as the control board 1 except that the control board 19 does not have the capacitors)

FIG. 3 is a schematic view showing the conductive pattern 13 on the control board 19.

As shown in FIG. 3, the conductive pattern 13 on the control board 19 is formed in the vicinity of the through hole 12 for the connector 11 to which the wire harness 10 is connected.

Note that, in FIG. 3, the conductive pattern 13 is provided in more inward area on the board than the through hole 12 to which the connector 11 is connected. However, the conductive pattern 13 may be formed in the vicinity of the through hole 12 and outwardly at the edge side of the board, in other words, in more outward area than the through hole 12.

Note that the control board 1 and the control board 19 may be produced by using either a subtractive process in which a circuit is created by removing unwanted portions from the copper-applied board through etching process, or an additive method in which a circuit pattern is added to an insulation board.

Next, the control board 1 having the capacitors 15 mounted on the conductive patterns 13 of the control board 19 will be described with reference to FIG. 4.

Figure 4:
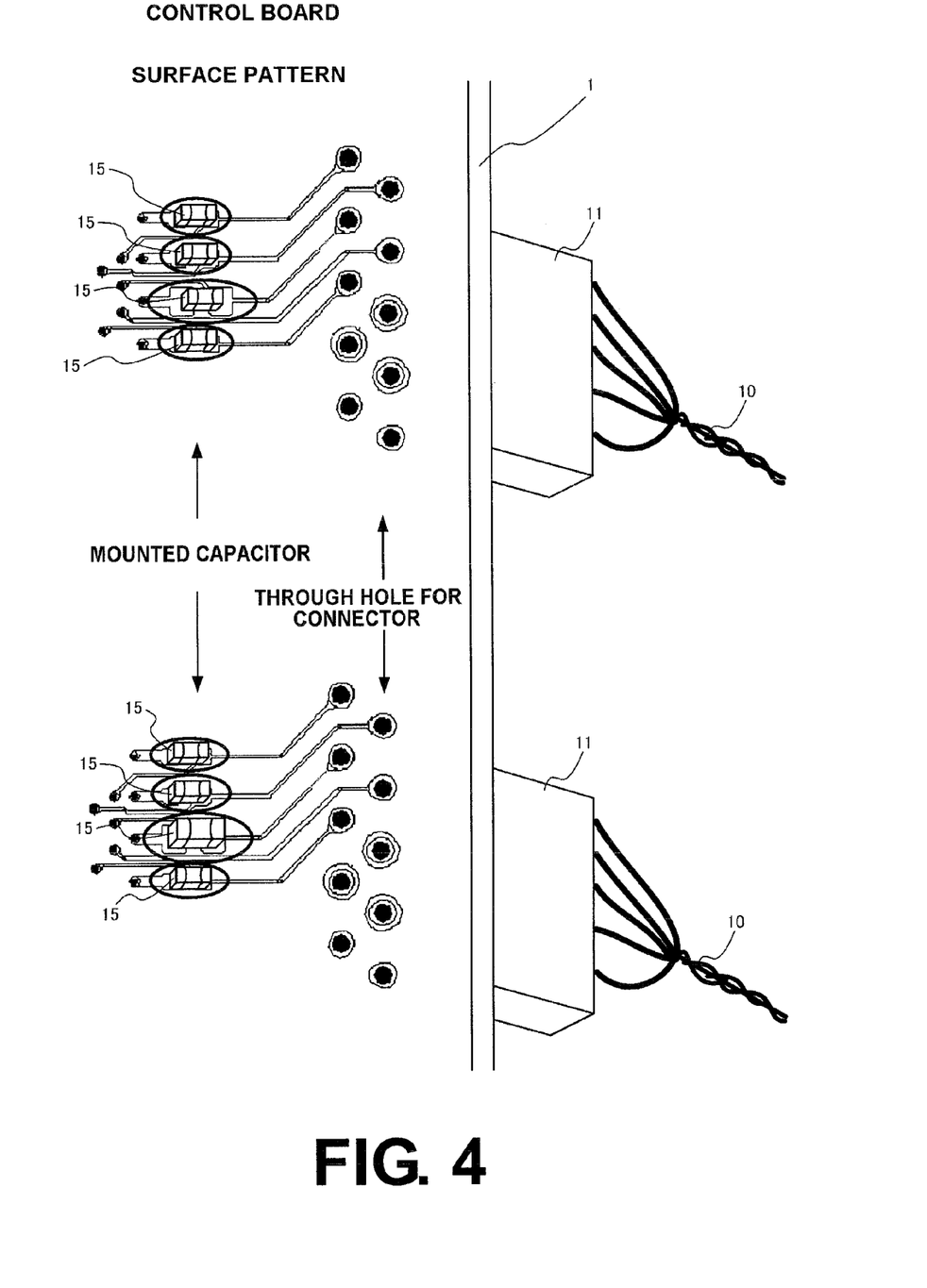
FIG. 4 is a schematic view showing the control board 19 having the capacitors 15 mounted thereon.

As shown in FIG. 4, on the control board 1, the chip capacitors 15 are mounted on the conductive patterns 13 on the control board 19.

Note that, in the description above, the conductive patterns 13 on the control board 1 are formed in the vicinity of the through holes 12 in a case where the connectors 11 are connected to a surface opposite to the pattern surface through the through holes 12. However, the conductive patterns 13 may be formed in the vicinity of a connection terminal at which the connectors 11 are connected to the control board 1 in a case where the connectors 11 are connected to the same side as the pattern surface of the control board 1.

Note that, in the description above, the connections between the wire harnesses 10 and the control board 1 are made through the connectors 11. However, in a case where the wire harnesses 10 are connected with the control board 1 directly by soldering to terminals on the control board 1 and so on, the conductive patterns 13 are formed in the vicinity of the connection terminals.

As described above, the conductive patterns 13, which are formed on the control board 1 (control board 19) and on which the capacitors 15 for suppressing the unwanted electromagnetic wave emission from the wire harnesses 10 are mounted, are formed in the vicinity of the connection terminals (including the through hole 12) through which the wire harnesses 10 are connected with the control board 1 (control board 19).

Next, a circuit diagram in connection with the capacitor 15 mounted on the control board 1 will be described with reference to FIG. 5.

Figure 5:
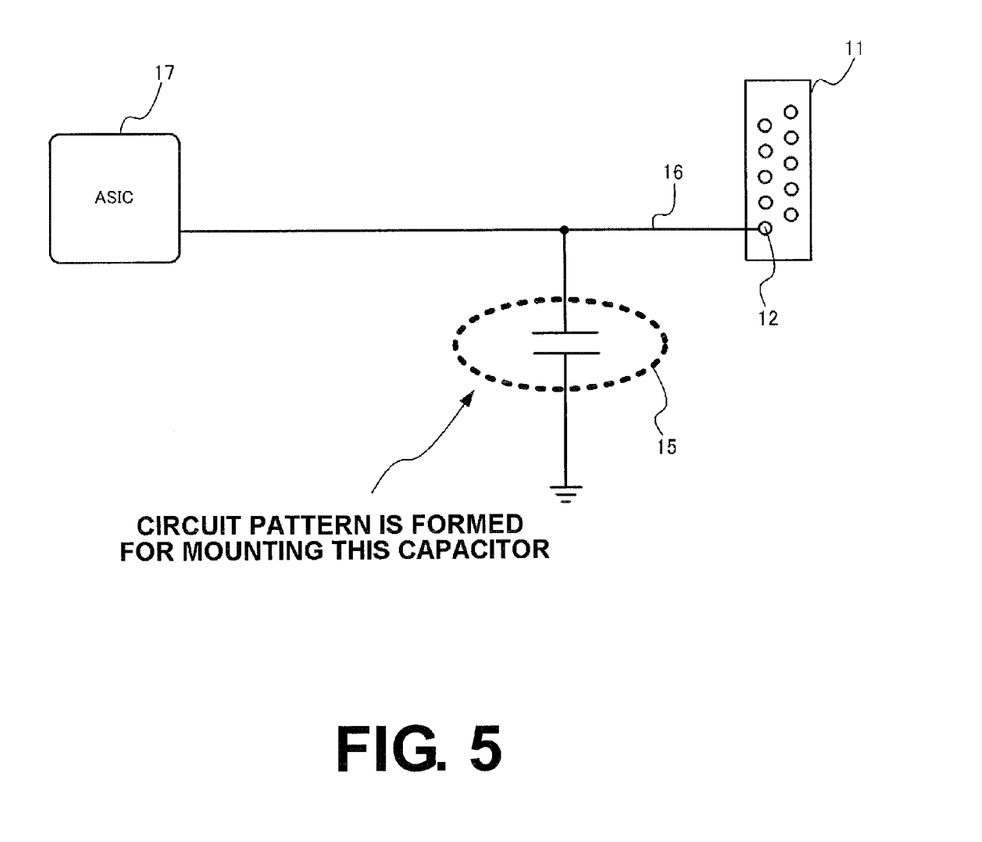
FIG. 5 is a schematic circuit diagram of the control board 1.

FIG. 5 is a circuit diagram including the capacitor 15 mounted on the conductive pattern 13 of the control board 1.

On the control board 1, each signal line 16 is connected with an ASIC (Application Specific Integrated Circuit) 17 mounted on the control board 1 through each of the through holes 12 to which the connector 11 is connected, while each of the capacitors 15 is placed between the signal line 16 and the ground (grounding surface).

Note that the signal line 16 extending from the through hole 12 is not necessarily connected with the ASIC 17. It is only necessary that the capacitor 15 be placed between the ground and the signal line 16 extending from a terminal to which the wireless harness 10 is connected.

Additionally, as described above with reference to FIGS. 3 and 4, the capacitors 15 are placed in the vicinity of the terminals (through holes 12) to which the wire harnesses 10 are connected on the control board 1.

With the above-described arrangement of the capacitors 15 placed in the vicinity of the through holes 12, the unnecessary electrical charge is accumulated in the capacitors 15, whereby the emission of the unwanted electromagnetic wave from the wire harnesses 10 can be suppressed at the time when the signal flows from the control board 1 through the wire harnesses 10.

Next, experimental results obtained by measuring the electromagnetic wave emitted from the image formation apparatus will be described with reference to FIGS. 6A through 6C.

Figure 6A:
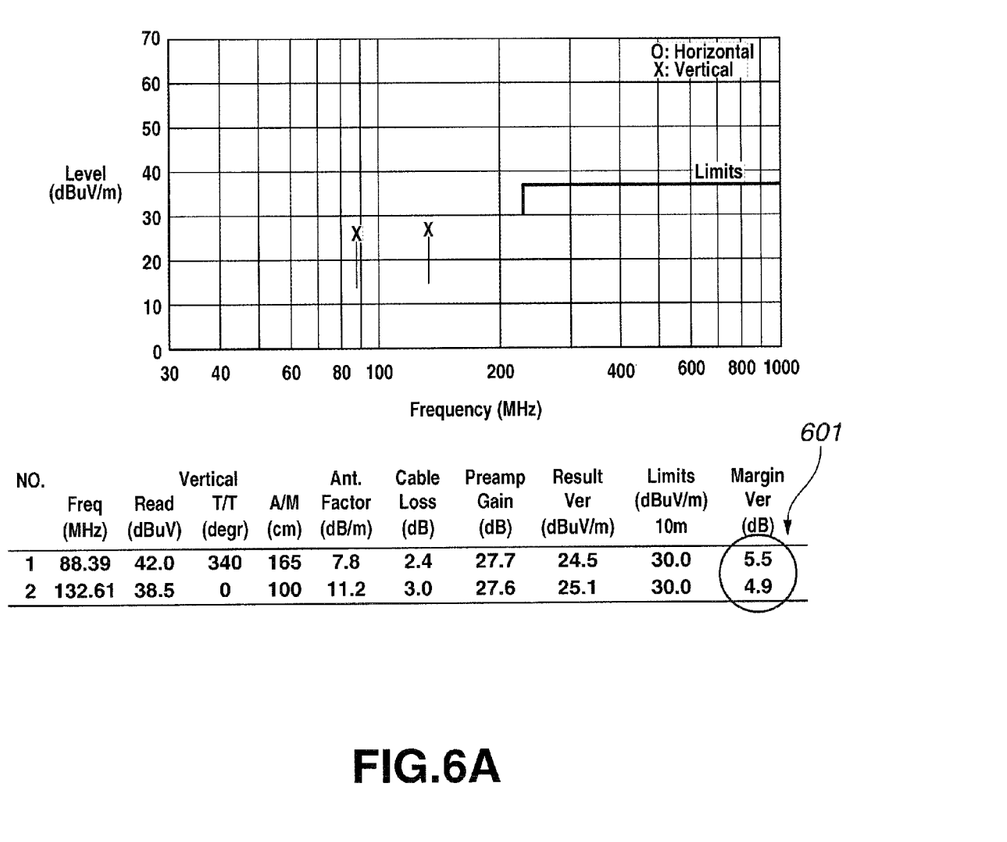
FIGS. 6A through 6C are data obtained by measuring electromagnetic waves emitted from an image formation apparatus.
Figure 6B:
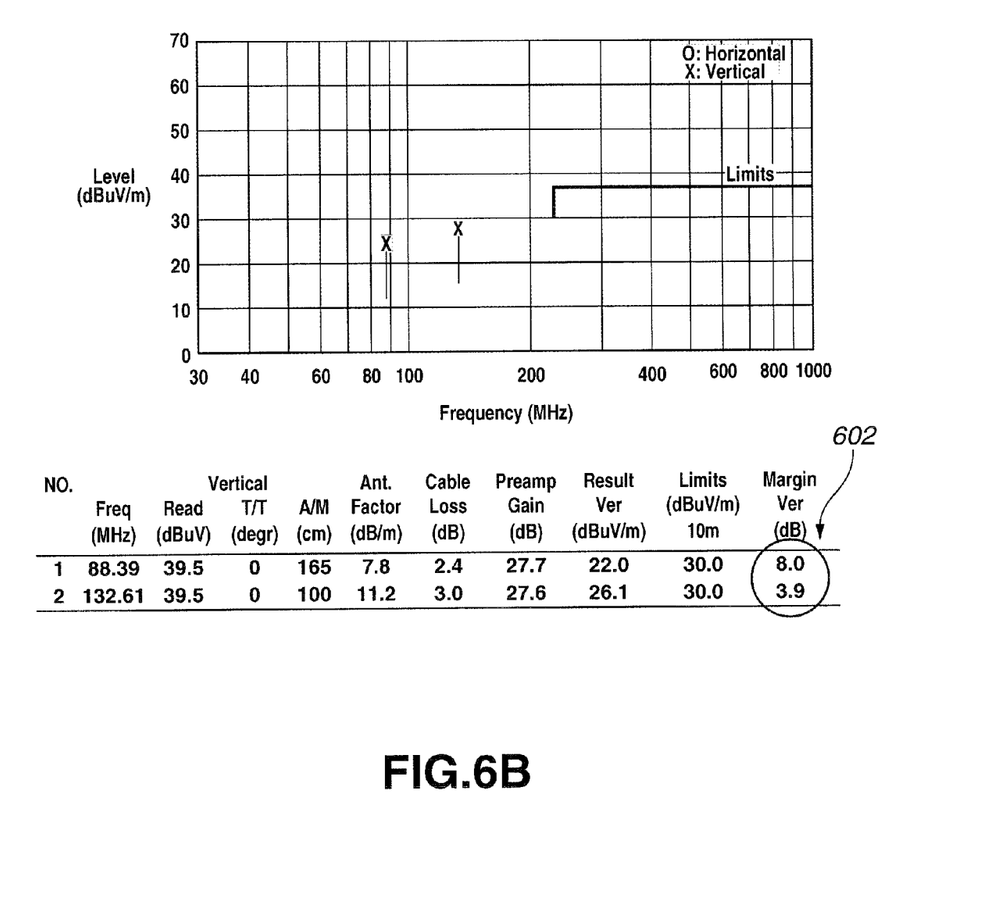
Figure 6C:
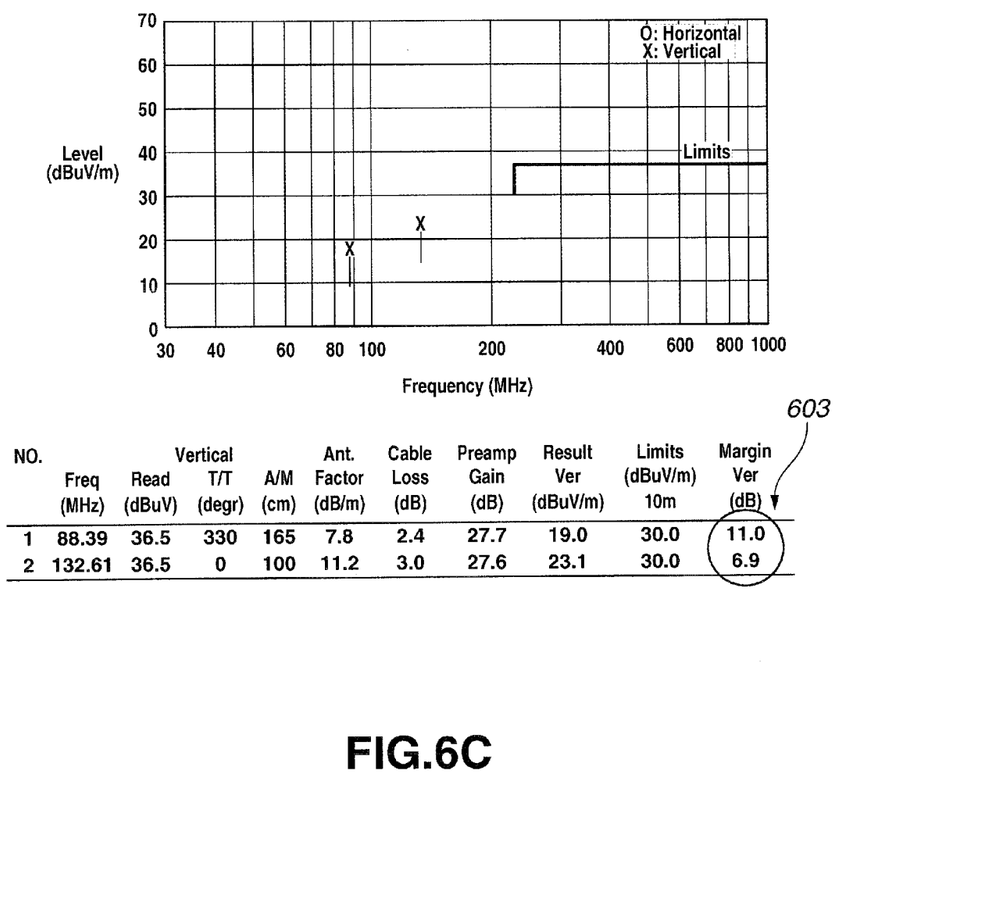

FIGS. 6A through 6C are data showing experimental results obtained by measuring the electromagnetic wave emitted from the image formation apparatus. FIG. 6A shows data obtained by measuring the electromagnetic wave emitted from the image formation apparatus without any specific countermeasure; FIG. 6B shows data obtained by measuring the electromagnetic wave emitted from the image formation apparatus in which a ferrite core is attached to a wire harness connecting a main motor with a control board for performing integrated control; and FIG. 6C shows data obtained by measuring the electromagnetic wave emitted from the image formation apparatus having the control board 1 according to the present invention.

As shown in FIG. 6A, in a case of the image formation apparatus without any specific countermeasure, the electromagnetic wave of 5.5 dB at 88.39 MHz and the electromagnetic wave of 4.9 dB at 132.61 MHz are obtained. The higher the value indicated by a unit of "dB" in the data shows, the better the results are. In other words, as the obtained value increases, the countermeasure to suppress the emission of the electromagnetic wave has a better effect.

Next, a description will be made of a case of the image formation apparatus having a countermeasure taken such that a ferrite core is attached to a wire harness connecting a main motor with a control board for performing integrated control. As shown in FIG. 6B, the electromagnetic wave of 8.0 dB at 88.39 MHz and 3.9 dB at 132.61 MHz are obtained. As compared with the data obtained in the case of the image formation apparatus having no specific countermeasure taken as described above, the value of the electromagnetic wave increases from 5.5 dB to 8.0 dB at 88.39 MHz, and the better effect can be obtained by attaching the ferrite core, while any specific effect of the ferrite core cannot be seen as to the value at 132.61 MHz.

Next, a description will be made of a case of the image formation apparatus having the control board 1 according to the present invention. As shown in FIG. 6C, the electromagnetic wave of 11.0 dB at 88.39 MHz, and 6.9 dB at 132.61 MHz are obtained. As compared with the data obtained in the case of the image formation apparatus having no specific countermeasure taken as described above, the value of the electromagnetic wave increases from 5.5 dB to 11.0 dB at 88.39 MHz, and from 4.9 dB to 6.9 dB at 132.61 MHz. Thus, the better effect can be obtained as compared to the effect obtained by attaching the ferrite core can be obtained.

As described above, with the image formation apparatus having the control board 1 according to the present invention, the higher effect can be obtained in terms of the reduction in the emission of the electromagnetic wave, as compared to the image formation apparatus having the ferrite core attached thereto.

Next, with reference to FIG. 7, a component connected through the wire harness with the control board for performing the integrated control of the image formation apparatus will be described.

Figure 7:
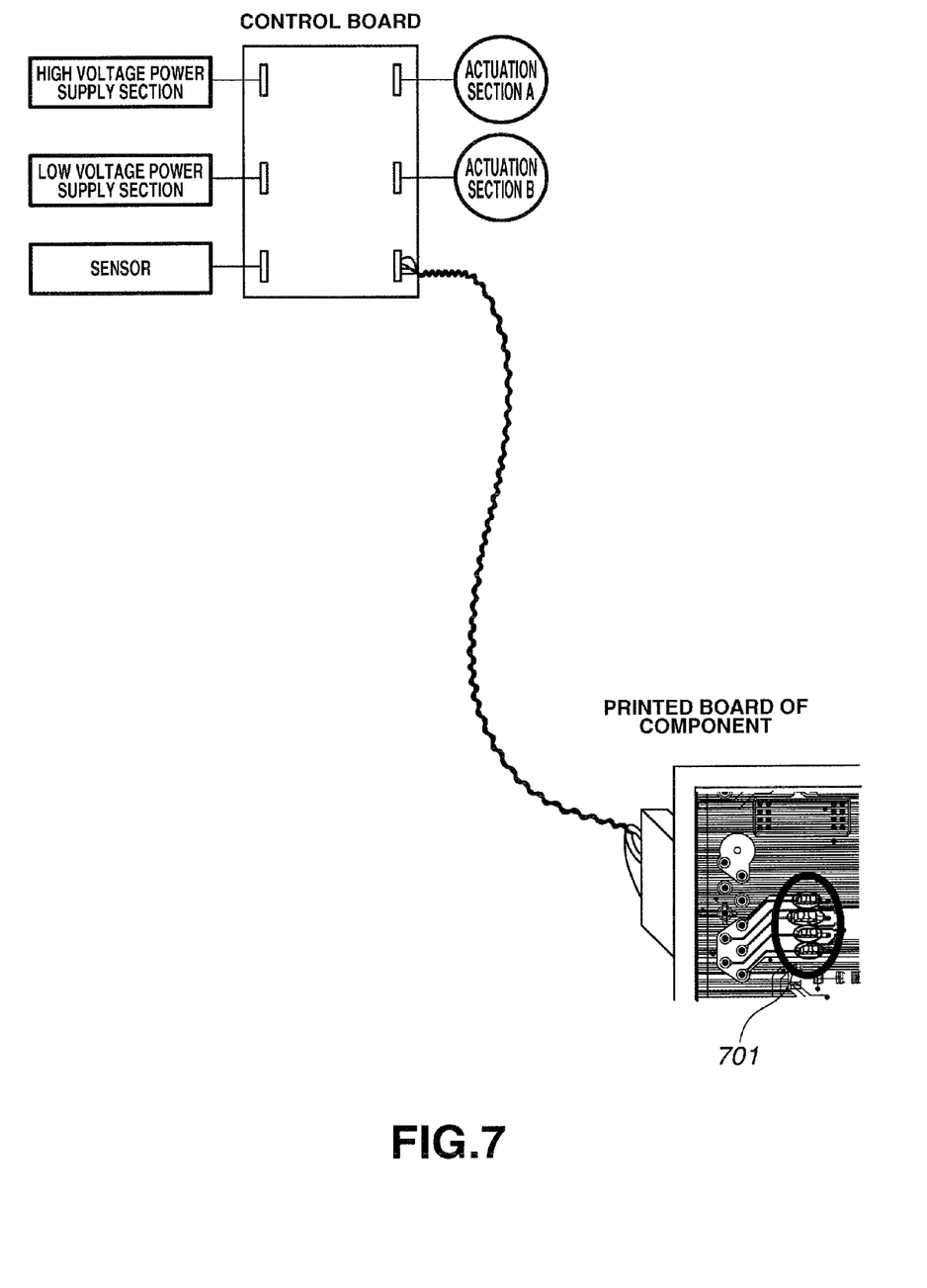
FIG. 7 is a schematic view showing a control board and a printed board of a component.

FIG. 7 is a schematic view showing a printed board of a component in the image formation apparatus.

As shown in FIG. 7, in order to suppress the emission of the unwanted electromagnetic wave from a wire harness connected with a control board for performing integrated control of the image formation apparatus, capacitors are provided to a printed board of a component controlled by and connected with the control board through the wire harness (reference numeral 701), as is the case with the capacitors 15 described with reference to FIG. 4.

Like the capacitors 15 described above with reference to FIG. 4, the capacitors on the printed board of the component as shown in FIG. 7 are placed between the grounding surface and the signal line from the wire harness, in the vicinity of a terminal to which the wire harness is connected. This arrangement makes it possible to suppress the emission of the unwanted electromagnetic wave from the wire harness caused by a signal transmitted from the component.

As described above, in the image formation apparatus, the capacitors are placed on the printed board between the grounding surface and the signal line from the wire harness in the vicinity of the terminal to which the wire harness is connected in order to suppress the emission of the unwanted electromagnetic wave from the wire harness generated from the signal transmitted from the printed board to which the capacitors are provided. Note that the capacitors are provided not only to the printed board connected through the wire harness with the control board for performing the integrated control of the image formation apparatus. The capacitors may also be provided to any printed board connected through the wire harness.

Next, with reference to FIG. 8, a description will be made of a case where the capacitors for suppressing the emission of the unwanted electromagnetic wave from the wire harness are provided to both of the control board 1 for performing the integrated control of the image formation apparatus and the printed board of the component connected through the wire harness 10.

Figure 8:
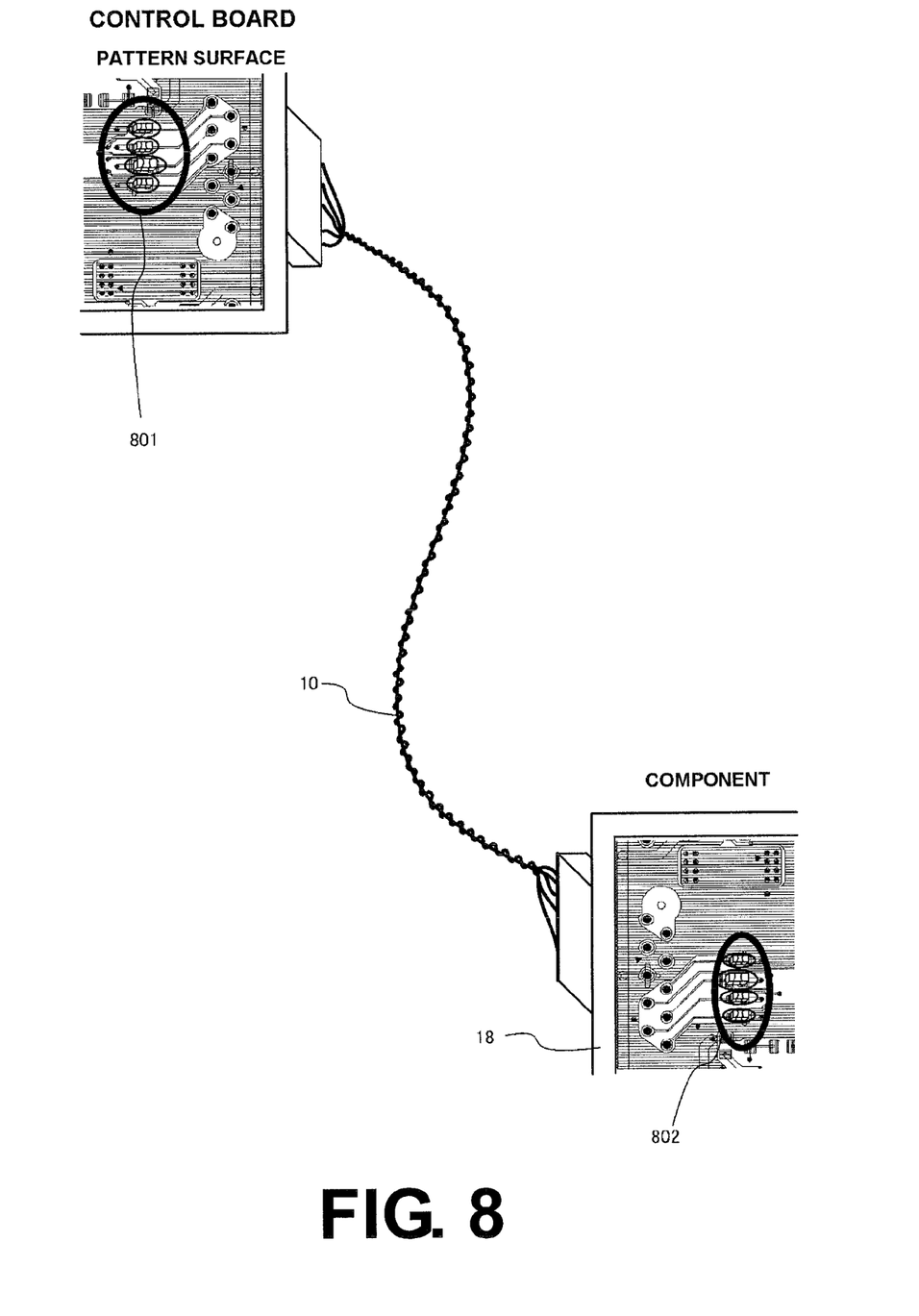
FIG. 8 is a schematic view showing the control board 1 and a printed board 18 of a component.

FIG. 8 is a schematic view illustrating a case where the capacitors for suppressing the emission of the unwanted electromagnetic wave from the wire harness 10 are provided to both of the control board 1 and a printed board of a component controlled by the control board 1.

As shown in FIG. 8, on a printed board 18 of a component connected through the wire harness 10, conductive patterns for mounting a capacitor are formed as is the case with the conductive patterns 13 for mounting the capacitor on the control board 1, and the capacitors are provided on the formed conductive pattern (reference numeral 802). Additionally, the capacitors 15 are provided on the control board 1 that is connected with the printed board 18 through the wire harness 10 (reference numeral 801).

As is the case with the control board 1, the capacitors provided on the printed board 18 of the component are placed in the vicinity of a terminal to which the wire harness 10 is connected, and are placed between the grounding surface and a signal line from the wire harness 10.

As described above and shown in FIG. 8, the image formation apparatus (corresponding to an image formation apparatus of claims) may have a configuration in which the capacitors for suppressing the emission of the electromagnetic wave from the wire harness 10 are provided to both of the control board 1 for performing the integrated control of the image formation apparatus and the printed board 18 controlled by the control board 1. With this configuration, the suppression of the emission of the electromagnetic wave from the wire harness 10 can be achieved for each signal from both of the control board 1 and the printed board 18, while input/output impedances are adjustable in both boards.

Note that the capacitors for suppressing the emission of the electromagnetic wave from the wire harness may be mounted not only on the control board for performing the integrated control of the image formation apparatus and the printed board of the component to be controlled, but also on any given printed board connected with a wire harness in the image formation apparatus.

Note that a configuration of the printed board and the image formation apparatus is not limited to the configuration in which the wire harness is connected to a single printed board. Alternatively, the printed board and the image formation apparatus may also have a configuration in which the wire harness is connected to plural printed boards.

Note that, in the foregoing description, the chip capacitors are mounted to the control board 1 as the capacitor 15. However, a type of capacitor to be mounted on the printed board or in the image formation apparatus according to the present invention is not limited to the chip capacitor. It may be possible to employ an electrolytic capacitor, a tantalum capacitor or other types of capacitor, provided that the capacitors corresponding to that in the circuit diagram described with reference to FIG. 5 are placed in the vicinity of a terminal to which the wire harness 10 is connected.

The present invention is applicable to the printed board and the image formation apparatus.

The foregoing description of the exemplary embodiment of the present invention is provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A printed board, comprising:
   an input/output terminal connected with a first end of a cable that has a second end connected with a component in an image formation apparatus, the component not being on the printed board;
   a control circuit that controls the component connected to the second end of the cable;
   a conductive pattern being formed in the vicinity of the input/output terminal; and
   a capacitor mounted between a grounding surface and a signal line from the input/output terminal, the capacitor being configured to suppress an emission of an electromagnetic wave from the cable.

2. The printed board according to claim 1, wherein the capacitor is placed on the conductive pattern.

3. A printed board comprising:
an input/output terminal connected with a first end of a cable that has a second end connected with a component in an image formation apparatus, the component not being on the printed board;
a control circuit that controls the component connected to the second end of the cable;
a conductive pattern being formed between a grounding surface and a signal line from the input/output terminal; and
a capacitor mounted on the conductive patter, the capacitor being configured to suppress an emission of an electromagnetic wave from the cable, wherein,
no other junction exists between the input/output terminal and a junction on the signal line at which the capacitor is connected.

4. The printed board according to claim 3, wherein the capacitor is placed on the conductive pattern.

5. An image formation apparatus, comprising:
At least one component;
a plurality of first printed boards having a first input/output terminal that connects with a cable and that is provided with a first conductive pattern on which a capacitor is mounted between a grounding surface and a signal line extending via a first through hole from the first input/output terminal on each one of the first printed board surfaces opposite to each one of the first printed board surfaces on which the first input/output terminal is provided and adjacent the first through hole, the capacitor having a capacitance set based on a signal-rise-delay time and a signal-rise-delay time and a signal-fall-delay time necessary for operating the at least one component and that suppresses an emission of an electromagnetic wave from the cable; and
a second printed board having a plurality of second input/output terminals, each connected with each of the first printed boards through the cable and having a control circuit that controls the at least one component, the second printed board being provided with a second conductive pattern on which a capacitor is mounted between the grounding surface and a signal line extending via a second through hole from each of the second input/output terminals on the second printed board surface opposite to the second printed board surface on which the second input/output terminal is provided and adjacent the second through hole, the capacitor having a capacitance set based on a signal-rise-delay time and a signal-fall-delay time necessary for operating the at least one component and that suppresses the emission of the electromagnetic wave from the cable.

* * * * *